United States Patent
Casagrande

(10) Patent No.: US 6,907,236 B2
(45) Date of Patent: Jun. 14, 2005

(54) MIXER FOR DUAL CONVERSION RECEIVER

(75) Inventor: Arnaud Casagrande, Ligniéres (CH)

(73) Assignee: Asulab S.A., Marin (CH)

( * ) Notice: Subject to any disclaimer, the term of this patent is extended or adjusted under 35 U.S.C. 154(b) by 467 days.

(21) Appl. No.: 10/259,324

(22) Filed: Sep. 30, 2002

(65) Prior Publication Data

US 2003/0078017 A1 Apr. 24, 2003

(30) Foreign Application Priority Data

Oct. 22, 2001 (CH) .............................................. 1939/01

(51) Int. Cl.$^7$ ............................................... H04B 17/02
(52) U.S. Cl. ...................... 455/333; 455/208; 455/280; 455/323; 331/36 R
(58) Field of Search ................................ 455/136, 137, 455/138, 140, 141, 130, 168.1, 208, 209, 210, 230, 255, 256, 259, 277.1, 280, 293, 307, 309, 311, 312

(56) References Cited

U.S. PATENT DOCUMENTS

| | | | | |
|---|---|---|---|---|
| 5,448,772 A | | 9/1995 | Grandfield | |
| 5,982,457 A | * | 11/1999 | Limberg | 348/725 |
| 6,061,096 A | * | 5/2000 | Limberg | 348/555 |
| 6,144,846 A | | 11/2000 | Curec | |
| 6,219,108 B1 | * | 4/2001 | LeRoy | 348/724 |
| 6,509,796 B2 | * | 1/2003 | Nguyen et al. | 330/254 |

* cited by examiner

Primary Examiner—Edward F. Urban
Assistant Examiner—Thuan Nguyen
(74) Attorney, Agent, or Firm—Sughrue Mion, PLLC

(57) ABSTRACT

The invention concerns a mixer, in particular for an dual conversion receiver. The mixer includes a first variable transconductance stage (A) controlled by a high frequency carrier signal, this first stage including first (37) and second (38) terminals delivering a first signal; and a second stage (B) connected to said first terminal of the first stage including, in parallel, first (T32) and second (T33) switching means respectively controlled by first (in2) and second (in2b) phase opposition control signals at a first intermediate frequency (IF1), these first and second switching means being powered by a substantially equal current supplied by polarisation means (34). The mixer according to the invention is characterised in that it further includes means (T36) for modulating said first signal delivered by said first stage by means of a third control signal (in3) at a second intermediate frequency (IF2).

6 Claims, 2 Drawing Sheets

MIXER FOR DUAL CONVERSION RECEIVER

The present invention concerns a mixer structure used, in particular, in a dual conversion receiver. This type of receiver is used in mobile telephony.

The mixer includes a first variable transconductance stage controlled by a high frequency carrier signal, and a second stage connected to the first stage including, in parallel, first and second switching means respectively controlled by first and second phase opposition control signals at a first intermediate frequency, these first and second switching means being powered by a substantially equal current supplied by polarisation means.

A mixer structure of this type is known in the prior art as shown in FIG. 1. The mixer includes a first transistor T1 operating in an amplifying mode having its source connected to earth, its gate controlled by a signal in1 at a given frequency and its drain connected to the source of first T2 and second T3 switching mode transistors. The control signal of the amplifying mode transistor can be either an external high frequency signal RF received by means of an antenna that is not shown, or a signal directly delivered by a local oscillator having its own frequency. The first T2 and second T3 switching mode transistors receive at their gate phase opposition control signals in2 and in2b at an intermediate frequency IF lower than the frequency of the control signal of transistor T1 operating in an amplifying mode. Polarisation means 4 are provided for these transistors T2 and T3 operating in a switching mode, in the form of current sources connected to their drain.

The two transistors T2 and T3 operating in a switching mode enable, in particular, the frequency of the control signal of transistor T1 operating in an amplifying mode to be shifted, either by lowering this frequency or by increasing this latter. Thus, phase opposition signals out and outb at frequencies RF−IF and RF+IF are present at the mixer output, i.e. at the drain of these two transistors T2 and T3. As the useful signals at output are current signals, a resistor 5 acting as a current-voltage converter is provided between the drain of transistors T2 and T3 operating in a switching mode.

Such mixers are used in a dual conversion receiver in order to lower the high frequency of the signal RF received at a baseband frequency. A receiver using such mixers is shown in FIG. 2. The receiver includes at least an antenna 11 tuned so as to receive external signals at a given high RF frequency, for example 900 MHz. A local oscillator 12 delivers a clock signal at a frequency LO lower than the RF frequency of the received external signal, for example 600 MHz. A first output of the local oscillator is connected to frequency divider means 13 which enable four-phase signals I, Ib, Q and Qb to be obtained at an intermediate frequency IF, for example 300 MHz.

A first conversion stage E1 formed of two mixers 14 and 15, as defined in FIG. 1, enable four-phase signals Ic, Icb, Qc and Qcb, phase shifted at the RF frequency of the received external signal, for example 900 MHz, to be obtained at the output of said stage E1.

The first mixer 14 receives as control signals for the two switching mode transistors, defined in FIG. 1, phase opposition signals I and Ib at intermediate frequency IF (300 MHz) and as a control signal for the amplifying mode transistor, also described in FIG. 1, the clock signal of local oscillator 12 (600 MHz). The signals Ic and Icb obtained at the output of the mixer are phase opposition signals particularly at the frequency LO+IF.

The second mixer 15 receives, as control signals for the two switching mode transistors, phase opposition signals Q and Qb respectively in phase quadrature with control signals I and Ib of mixer 14 and as a control signal for the amplifying mode transistor, the clock signal of local oscillator 12.

Thus at the output of the two mixers 14 and 15, four-phase signals Ic, Icb, Qc and Qcb are obtained, particularly at the RF frequency but also at frequencies IF, LO, LO−IF.

It is important to note that frequency LO of the clock signal of local oscillator 12 and intermediate frequency IF of the signals at the output of frequency divider means 13 are chosen such that the addition of these frequencies LO+IF corresponds to the RF frequency of the received external signal.

The receiver also includes a second reception and conversion stage E2 also formed of two mixers 16 and 17 as described in FIG. 1.

The third mixer 16 receives, as control signals for the two switching mode transistors, phase opposition signals Ic and Icb delivered at the output of mixer 14, and as a control signal for the amplifying mode transistor, an external RF high frequency signal received by antenna 11.

Fourth mixer 17 receives as control signals for the two switching mode transistors phase opposition signals Qc and Qcb respectively in phase quadrature with control signals Ic and Icb of third mixer 16, delivered at the output of second mixer 15, and as a control signal for the amplifying mode transistor, the external high frequency RF signal received by antenna 11.

Baseband four-phase signals Iout, Ioutb, Qout and Qoutb are delivered at the output of the switching mode transistors of third and fourth mixers 16 and 17. Signals at different frequencies are also delivered at output, for example RF, IF, LO, RF+LO+IF . . .

The major drawback of such a receiver is that it requires the use of four mixers 14, 15, 16 and 17 to obtain baseband four-phase signals. Each mixer includes means 4 for polarising the switching mode transistors. Conventionally, these polarisation means are current sources. The use of four mixers necessarily involves having eight current sources. As this type of receiver is mainly intended for applications such as mobile telephony, reduction in current consumption is a fundamental issue. The receiver shown in FIG. 2 consumes too much current, while occupying a significant amount of space on the integrated circuit.

One solution that could be envisaged by those skilled in the art would be to combine a mixer structure as described in FIG. 1 differently, to obtain a dual conversion receiver using only three mixers. Such a receiver is shown in FIG. 3.

Like the receiver shown in FIG. 2, this receiver includes at least one antenna 21 tuned so as to receive external signals at a given high RF frequency. A local oscillator 22 delivers a clock signal at a frequency LO lower than an RF frequency of the signal received by antenna 21. A first output of local oscillator 22 is connected to frequency divider means 23 which enable four-phase signals I, Ib, Q, Qb to be obtained at an intermediate frequency IF.

A first mixer 24 allows the frequency of the external high frequency RF signal received by antenna 21 to be lowered to intermediate frequency IF. In order to do this, mixer 24 receives as control signals for the two switching mode transistors, described in FIG. 1, phase opposition signals IIo and IInob at frequency LO of local oscillator 22 and, as control signal for the amplifying mode transistor, also described in FIG. 1, the external signal at a high frequency RF received by antenna 21.

Signals Ic and Icb, frequency shifted, particularly to intermediate frequency IF, are delivered at the output of the switching mode transistors of first mixer 24.

Second 25 and third 26 mixers allow frequency IF of the signal Ic obtained at the output of first mixer 24 to be lowered, in order to obtain baseband four-phase signals Iout, Ioutb, Qout and Qoutb.

Second mixer 25 receives as control signals for the two switching mode transistors, phase opposition signals I and Ib at intermediate frequency IF supplied at the output of frequency divider means 23 and as a control signal for the amplifying mode transistor, the signal Ic at intermediate frequency IF delivered at the output of first mixer 24.

Third mixer 26 receives, as control signals for the two switching mode transistors, phase opposition signals Q and Qb respectively in phase quadrature with control signals I and Ib of second mixer 25, supplied at the output of frequency divider means 23 and as a control signal for the amplifying mode transistor, the signal Ic at intermediate frequency IF delivered at the output of first mixer 24.

The signals supplied at the output of the receiver are baseband four-phase signals Iout, Ioutb, Qout and Qoutb.

The current consumption of the receiver according to this solution is also too high and it occupies too much space on the integrated circuit. Three mixers are still necessary and since the control signals of the two mixers 25 and 26 are provided by the same mixer 24, the current consumption of mixer 24 is higher than the normal consumption of a single conventional mixer.

In order to overcome the drawbacks of the aforementioned prior art, the invention is characterised in that it concerns a mixer structure allowing the dual conversion function to be achieved with greatly reduced power consumption.

The invention thus concerns a mixer as defined in the preamble characterised in that it further includes means for modulating the first signal delivered by the first stage by means of a third control signal at a second intermediate frequency.

The invention also concerns a dual conversion receiver using two mixers according to the invention.

The invention will now be explained in detail hereinafter for an embodiment given solely by way of example, this embodiment being illustrated by the annexed drawings, in which:

FIG. 1, already described, is a mixer structure according to the prior art;

FIG. 2, already described, is a dual conversion receiver according to the prior art;

FIG. 3, already described, is another dual conversion receiver;

Figure 1:
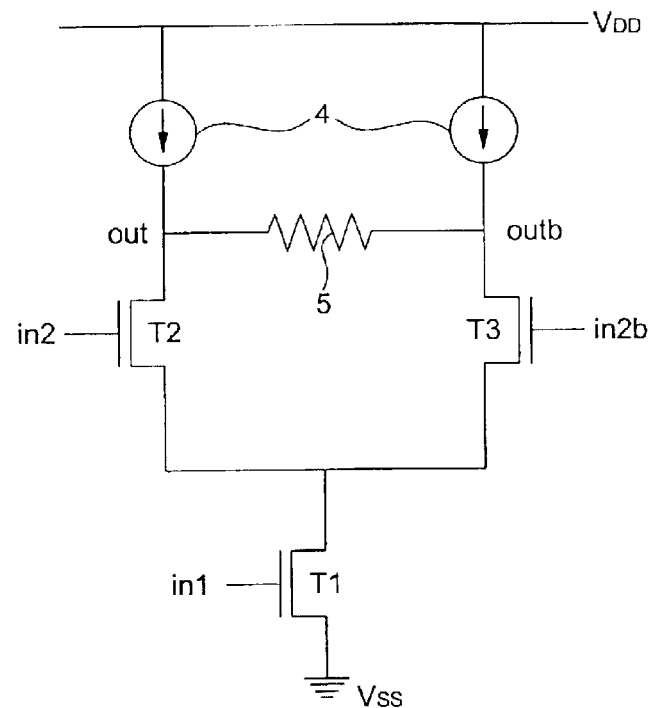
Figure 4:
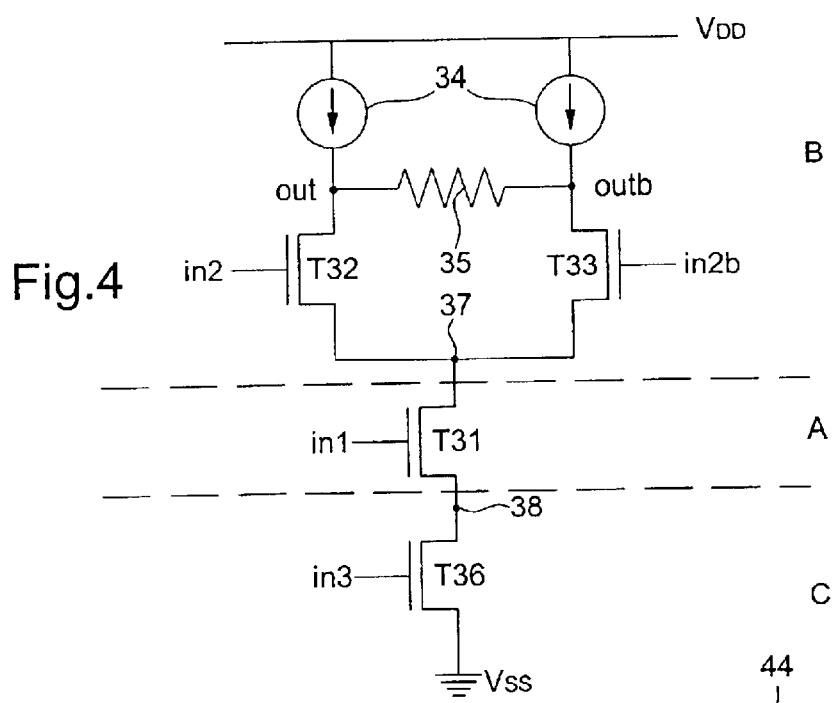
FIG. 4 is a mixer structure according to the invention.

The mixer structure, according to the invention, shown in FIG. 4, includes first and second stages similar to those presented in FIG. 1.

The first variable transconductance stage A can be formed by a first transistor T31 operating in an amplifying mode. This transistor is controlled at its gate by a high frequency RF control signal in1, for example 900 MHz, received by an antenna which is not shown. Its drain and its source form two terminals, respectively 37 and 38 delivering a useful signal. In this particular mixer structure, this useful signal is a current which varies as a function of the control signal in1 received at the gate of first amplifying mode transistor T31.

The second stage B connected to terminal 37 of first stage A includes switching means formed by first T32 and second T33 switching mode transistors. These first and second switching mode transistors T32 and T33 are respectively controlled at their gate by phase opposition control signals in2 and in2b, at a first intermediate frequency IF1, for example 300 MHz. Transistors T32 and T33 are respectively connected to terminal 37 of first stage A by their source, and are respectively powered at their drain by current sources 34 acting as polarisation means for these transistors T32 and T33. Preferably, a resistor 5 is placed between the drain of these two transistors T32 and T33, resistor 5 acting as a current-voltage converter.

The current delivered by the two current sources 34 is chosen to be substantially the same. As control signals in2 and in2b of first and second switching mode transistors T32 and T33 are in phase opposition, the current passing through said transistors is alternately interrupted at one or other of the two transistors. The mean current received at terminal 37 by first amplifying mode transistor T31 is substantially equal to that delivered by current sources 34. First amplifying mode transistor T31 behaves like a variable transconductance and allows a variable current to be supplied as a function of control signal in1 received at its gate, to modulation means. These means for modulating the current passing through the mixer allow a second mixer function to be achieved without increasing the power consumption of the initial mixer of FIG. 1.

The modulation means are preferably formed by a third transconductance stage C placed at terminal 38 of first stage A. This third transconductance stage C includes a second amplifying mode transistor T36 controlled at its gate by a control signal in3 at a second intermediate frequency IF2. The two terminals of this third stage C, namely the source and the drain of second amplifying mode transistor T36, are connected respectively to a reference potential Vss and to terminal 38 of first stage A.

The purpose of using such a mixer structure according to FIG. 4, is to lower the RF frequency of carrier signal in1, containing the useful signal, received at the gate of transistor T31 of first stage A at a baseband frequency in order to be able to recover this useful signal.

At terminal 38, the signal supplied is at the same frequency IF2 as that of control signal in3 of third stage C, namely at the second intermediate frequency. The first mixer function is achieved at first stage A via transistor T31, which allows the frequency of control signal in1 to be shifted and, in particular, to lower it to frequency RF−IF2, at terminal 37. Signals at frequencies RF, IF2, RF+IF2 are also present at terminal 37. Pass-band filtering means, which are not shown, around frequency RF−IF2 can be provided between first stage A and second stage B in order to keep only the useful signal at the desired lower frequency, i.e. for example 300 MHz.

The second mixer function is achieved at second stage B by means of the two transistors T32 and T33 which allow the frequency of the useful signal received at terminal 37 to be lowered, to a baseband frequency, RF−IF2−IF1, at the output terminals out and outb. The signals obtained at these output terminals out and outb are in phase opposition. Other signals at different frequencies, for example RF, IF2, IF1, RF+IF2+IF1, are also present at these two output terminals. Low-pass filtering means, not shown, can be provided at the output of the mixer in order to keep only the useful baseband signals.

In this mixer structure example, the signals recovered at output terminals out and outb are current signals, which is why a current-voltage converter is preferably placed at one output in order to convert the recovered signals into voltage signals. This current-voltage converter is achieved for example by adding a resistor 5 between the two output terminals out and outb of the mixer.

It is nonetheless possible to envisage a dual conversion mixer according to the invention allowing voltage signals to be recovered directly at output terminals or even using the current signals recovered without converting them.

Figure 5:
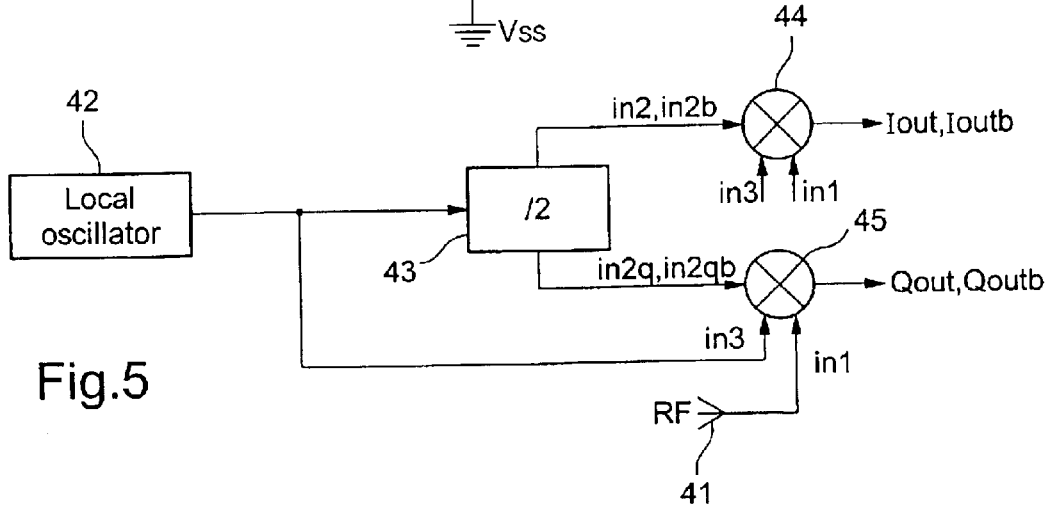
FIG. 5 is a dual conversion receiver according to the invention.

FIG. 5 shows a dual conversion mixer utilising two mixers according to FIG. 4.

Figure 2:
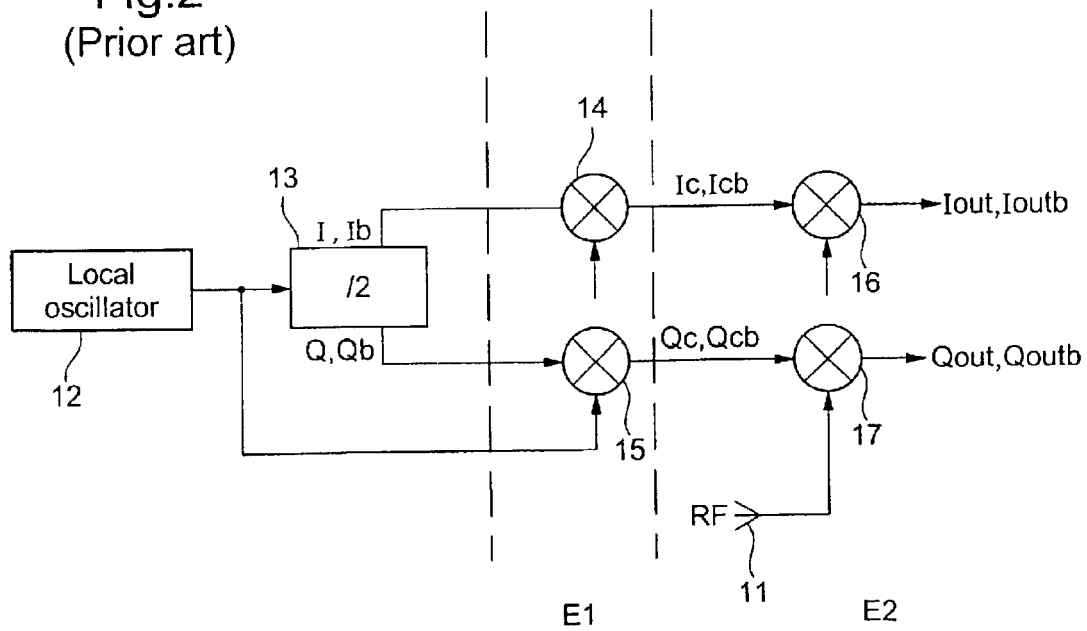
Figure 3:
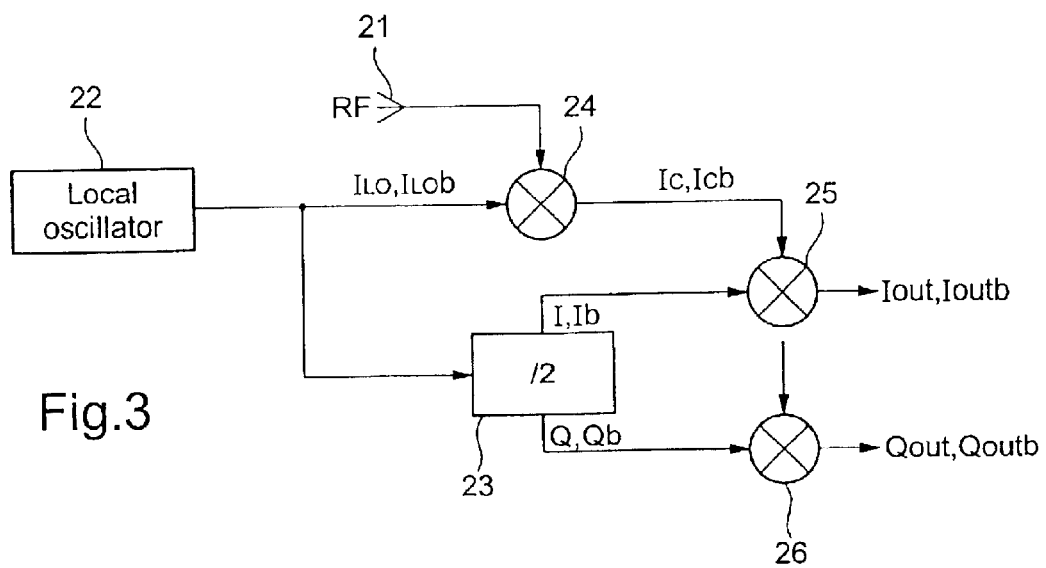

Like the receiver shown in FIG. 2, this receiver includes at least one antenna 41 tuned so as to receive external signals at a given high RF frequency. A local oscillator 42 delivers a clock signal at a natural frequency IF2 lower than the RF signal received by antenna 41. A first output of the local oscillator is connected to frequency divider means 43 which allow four-phase signals (in2, in2b, in2q and in2qb) to be obtained at an intermediate frequency IF1 dependent on the natural frequency IF2 of local oscillator 42, for example a ratio of two, then the natural frequency IF2 of the local oscillator being two times higher than intermediate frequency IF1.

The receiver also includes two mixers 44 and 45 according to the invention allowing baseband four-phase signals Iout, Ioutb, Qout and Qoutb to be delivered at their outputs.

First mixer 44 receives the clock signal delivered by local oscillator 42 as a control signal for its first stage, phase opposition signals in2 and in2b at intermediate frequency IF1 as control signals for its second stage, and the RF carrier signal delivered by the antenna as control signal for its third stage.

Second mixer receives the clock signal delivered by local oscillator as a control signal for its first stage, phase opposition signals in2q and in2qb respectively in phase quadrature with signals in2 and in2b at intermediate frequency IF1 as control signals for its second stage, and the RF carrier signal delivered by the antenna as control signal for its third stage.

As described in FIG. 4, each mixer performs dual mixing with the current consumption of a single mixer. Thus, the receiver's current consumption is greatly reduced.

The receiver according to the invention is capable of operating in all the mobile telephony frequency bands, for example 1.8 GHz, the frequency of the local oscillator and the number of stages of the frequency divider means having only to be adapted.

It is clear that the description is given only by way of example and that other embodiments, in particular of the dual conversion receiver, can form the subject of the present invention.

What is claimed is:

1. A mixer, in particular for a dual conversion receiver, including:
   a first variable transconductance stage controlled by a high frequency carrier signal, said first stage including first and second terminals delivering a first signal; and
   a second stage connected to said first terminal of said first stage including, in parallel, first and second switching means respectively controlled by first and second phase opposition control signals at a first intermediate frequency, said first and second switching means being powered by a substantially equal current supplied by polarisation means;
   wherein said mixer further includes means for modulating said first signal delivered by said first stage by means of a third control signal at a second intermediate frequency.

2. A mixer according to claim 1, wherein said modulation means include a third transconductance stage including first and second terminals respectively connected to said second terminal of the first stage and to a reference potential.

3. A mixer according to claim 2, wherein the variable transconductance of said first stage is formed by a first amplifying mode transistor, said first and second switching means of said second stage being respectively formed by first and second switching mode transistors, and the transconductance of said third stage is formed by a second amplifying mode transistor.

4. A mixer according to claim 3, wherein it further includes pass-band filtering means around the frequency of said first signal delivered at said first and second terminals of said first stage, said pass-band filtering means being placed between said first and second stage, and low-pass filtering means connected to at least a first output of said second stage and a current-voltage converter placed between said first output and a second output (outb) of said second stage.

5. A mixer according to claim 4, wherein the sum of said first and second intermediate frequencies is equal to the frequency of the carrier signal.

6. A dual conversion receiver including:
   at least one antenna receiving an external high frequency signal; and
   a local oscillator having a first output connected to frequency divider means delivering first, second, third and fourth four-phase control signals at a first intermediate frequency, and a second output supplying a fifth control signal at a second intermediate frequency,
   wherein said receiver further includes a first and a second mixer each according to the mixer of claim 1,
   said first mixer receiving as control signals, said external high frequency signal to control the first stage, said first and second four-phase control signals at a first intermediate frequency to control the second stage and said fifth control signal at a second intermediate frequency to control the third stage;
   said second mixer receiving as control signals, said external high frequency signal to control the first stage, said third and fourth four-phase control signals at a first intermediate frequency to control the second stage and said fifth control signal at a second intermediate frequency to control the third stage.

* * * * *